US012588357B2

(12) United States Patent
Seong et al.

(10) Patent No.: US 12,588,357 B2
(45) Date of Patent: Mar. 24, 2026

(54) LIGHT EMITTING DISPLAY APPARATUS INCLUDING AN UNDERCUT ALONG AN OUTER PERIPHERY OF AN ANODE

(71) Applicant: LG Display Co., Ltd., Seoul (KR)

(72) Inventors: Sejong Seong, Paju-si (KR);
KyungEon Lee, Paju-si (KR);
JongSung Kim, Paju-si (KR);
Seungkyeom Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 653 days.

(21) Appl. No.: 17/980,044

(22) Filed: Nov. 3, 2022

(65) Prior Publication Data

US 2023/0217680 A1 Jul. 6, 2023

(30) Foreign Application Priority Data

Dec. 31, 2021 (KR) ........................ 10-2021-0194757

(51) Int. Cl.
*H10K 50/813* (2023.01)
*H10K 59/122* (2023.01)

(52) U.S. Cl.
CPC ......... *H10K 50/813* (2023.02); *H10K 59/122* (2023.02)

(58) Field of Classification Search
CPC ........................... H10K 50/813; H10K 59/122
USPC ........................................................ 257/40
See application file for complete search history.

(56) References Cited

U.S. PATENT DOCUMENTS

| | | | |
|---|---|---|---|
| 2019/0115403 A1 | 4/2019 | Kang | |
| 2022/0181396 A1 | 6/2022 | Choi | |
| 2023/0189570 A1* | 6/2023 | Lin | H10K 59/80521 |
| | | | 257/40 |

FOREIGN PATENT DOCUMENTS

| | | |
|---|---|---|
| KR | 20160016339 A | 2/2016 |
| WO | 2023098283 A1 | 6/2023 |
| WO | 2023098292 A1 | 6/2023 |
| WO | 2023098301 A1 | 6/2023 |

* cited by examiner

*Primary Examiner* — Quoc D Hoang
(74) *Attorney, Agent, or Firm* — Seed Intellectual Property Law Group LLP

(57) ABSTRACT

A light emitting display apparatus includes a planarization layer provided in a substrate, a plurality of anodes provided on the planarization layer, a bank including opening regions exposing the plurality of anodes, a light emitting layer provided on the plurality of anodes and the bank, and a cathode provided on the light emitting layer, the cathode including a first cathode and a second cathode, wherein an undercut is provided at an outer portion of at least one of a first anode and a second anode adjacent to each other, and the first cathode and the second cathode disconnected from each other at the undercut are connected to each other at an end of the first anode or the second anode.

12 Claims, 12 Drawing Sheets

LIGHT EMITTING DISPLAY APPARATUS INCLUDING AN UNDERCUT ALONG AN OUTER PERIPHERY OF AN ANODE

CROSS-REFERENCE TO RELATED APPLICATIONS

This application claims the benefit of the Korean Patent Application No. 10-2021-0194757 filed on Dec. 31, 2021, which is hereby incorporated by reference as if fully set forth herein.

BACKGROUND

Technical Field

The present disclosure relates to a light emitting display apparatus.

Description of the Related Art

Light emitting display apparatuses are display apparatuses, which emit light by using a light emitting device, and each include a light emitting display panel including light emitting devices.

As a resolution of the light emitting display panel increases progressively, undesired light is emitted due to a lateral leakage current (LLC) between adjacent pixels.

BRIEF SUMMARY

The emission of undesired light caused by a lateral leakage current between adjacent pixels occurs due to a cathode and a light emitting layer continuously provided in adjacent pixels.

Accordingly, the present disclosure is directed to providing a light emitting display apparatus that substantially obviates one or more problems due to limitations and disadvantages of the related art including the technical problem identified above.

An aspect of the present disclosure is directed to providing a light emitting display apparatus in which a first cathode is disconnected from a second cathode at an undercut near an anode, and the first cathode is connected to the second cathode at an end, which is apart from an opening region, of the anode.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a light emitting display apparatus including a planarization layer provided in a substrate, a plurality of anodes provided on the planarization layer, a bank including opening regions exposing the plurality of anodes, a light emitting layer provided on the plurality of anodes and the bank, and a cathode provided on the light emitting layer, the cathode including a first cathode and a second cathode, wherein an undercut is provided at an outer portion of at least one of a first anode and a second anode adjacent to each other, and the first cathode and the second cathode disconnected from each other at the undercut are connected to each other at an end of the first anode or the second anode.

It is to be understood that both the foregoing general description and the following detailed description of the present disclosure are explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
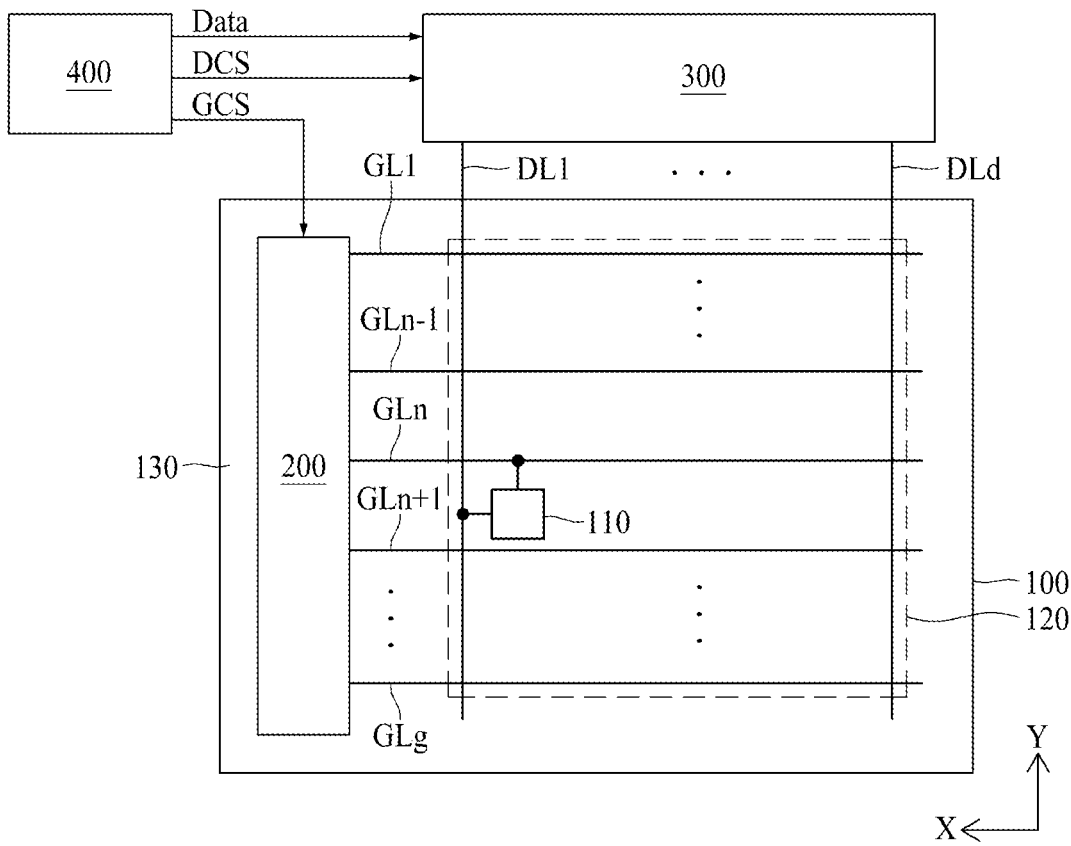
FIG. 1 is an example diagram illustrating a configuration of a light emitting display apparatus according to the present disclosure.

Reference will now be made in detail to the example embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a dimension (e.g., length, width, height, thickness, radius, diameter, area, etc.) a ratio, an angle, and a number of elements disclosed in the drawings for describing embodiments of the present disclosure are merely an example, and thus, the present disclosure is not limited to the illustrated details.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

Like reference numerals refer to like elements throughout. In the following description, when the detailed description of the relevant known function or configuration is determined to unnecessarily obscure the important point of the present disclosure, the detailed description will be omitted. When "comprise," "have," and "include" described in the present specification are used, another part may be added unless "only" is used. The terms of a singular form may include plural forms unless referred to the contrary.

In construing an element, the element is construed as including an error or tolerance range although there is no explicit description of such an error or tolerance range.

In describing a position relationship, for example, when a position relation between two parts is described as, for example, "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case that is not continuous may be included unless a more limiting term, such as "just," "immediate(ly)," or "direct(ly)" is used.

It will be understood that, although the terms "first," "second,", etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," "A," "B," "(a)," "(b)," etc., may be used. These terms are intended to identify the corresponding elements from the other elements, and basis, order, or number of the corresponding elements should not be limited by these terms. The expression that an element is "connected," "coupled," or "adhered" to another element or layer the element or layer can not only be directly connected or adhered to another element or layer, but also be indirectly connected or adhered to another element or layer with one or more intervening elements or layers "disposed," or "interposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings.

Figure 2:
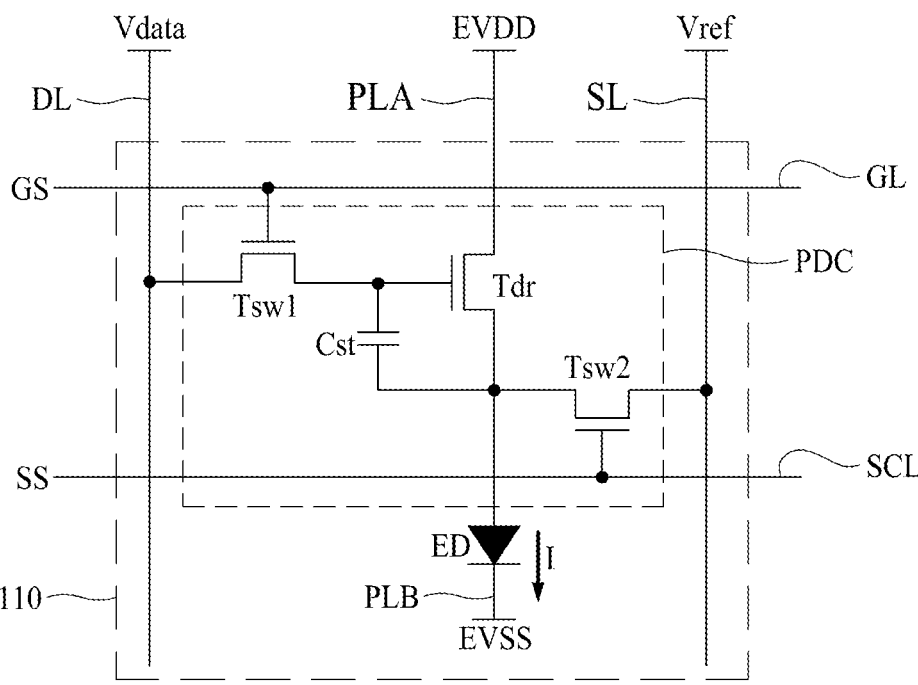
FIG. 2 is an example diagram illustrating a structure of a pixel applied to a light emitting display apparatus according to the present disclosure.

FIG. 1 is an example diagram illustrating a configuration of a light emitting display apparatus according to the present disclosure, and FIG. 2 is an example diagram illustrating a structure of a pixel applied to a light emitting display apparatus according to the present disclosure.

The light emitting display apparatus according to the present disclosure may configure various electronic devices. The electronic devices may include, for example, smartphones, tablet personal computers (PCs), televisions (TVs), and monitors, or the like.

The light emitting display apparatus according to the present disclosure, as illustrated in FIG. 1, may include a light emitting display panel 100 which includes a display area 120 displaying an image and a non-display area 130 provided outside or adjacent to the display area 120, a gate driver 200 which supplies a gate signal to a plurality of gate lines GL1, GLn−1, GLn, GLn+1, . . . to GLg provided in the light emitting display panel 100, a data driver 300 which supplies data voltages to a plurality of data lines DL1, DL2, . . . to DLd provided in the light emitting display panel 100, and a controller 400 which controls driving of the gate driver 200 and the data driver 300. Here, g and d may each be a natural number.

First, the light emitting display panel 100 may include the display area 120 and the non-display area 130. The gate lines GL1 to GLg, the data lines DL1 to DLd, and pixels 110 may be provided in the display area 120.

The pixel 110 included in the light emitting display panel 100, for example, as illustrated in FIG. 2, may include the pixel driving circuit PDC and an emission unit. The pixel driving circuit PDC may include a switching transistor Tsw1, a storage capacitor Cst, a driving transistor Tdr, and a sensing transistor Tsw2, and the emission unit may include the light emitting device ED.

The brightness of light may be controlled based on a level of a current I flowing in the light emitting device ED, a level of the current I flowing in the light emitting device ED may be controlled by the driving transistor Tdr, and the driving transistor Tdr may be controlled by a data voltage Vdata.

The light emitting device ED may include one of an organic light emitting layer, an inorganic light emitting layer, and a quantum dot light emitting layer, or may include a stack or combination structure of an organic light emitting layer (or an inorganic light emitting layer) and a quantum dot light emitting layer.

The light emitting device ED may emit light corresponding to one of various colors such as red, green, and blue, or may emit white light.

The switching transistor Tsw1 configuring the pixel driving circuit PDC may be turned on or off by a gate signal GS supplied to a gate line GL, and when the switching transistor Tsw1 is turned on, the data voltage Vdata supplied through a data line DL may be supplied to the driving transistor Tdr. A first voltage EVDD may be supplied to the driving transistor Tdr and the light emitting device ED through a first voltage supply line PLA, and a second voltage EVSS may be supplied to the light emitting device ED through a second voltage supply line PLB. The sensing transistor Tsw2 may be turned on or off by a sensing control signal SS supplied through a sensing control line SCL, and a sensing line SL may be connected to the sensing transistor Tsw2. A reference voltage Vref may be supplied to the pixel 110 through the sensing line SL, and a sensing signal associated with a characteristic variation of the driving transistor Tdr may be transferred to a sensing unit through the sensing transistor Tsw2 and the sensing line SL. The sensing unit may be included in the data driver 300 and may be provided independently of the data driver 300.

The pixel 110 applied to the present disclosure may be provided in a structure illustrated in FIG. 2, but the present disclosure is not limited thereto. Therefore, the pixel 110 applied to the present disclosure may be changed to various structures in addition to the structure illustrated in FIG. 2.

In the light emitting display panel 100, pixel areas where the pixels 110 are provided may be formed, and signal lines through which various signals are supplied to the pixel driving circuit PDC included in the pixel 110 may be formed.

For example, in the light emitting display panel including the pixel 110 as illustrated in FIG. 2, the signal lines may include the gate line GL, the data line DL, the sensing control line SCL, the first voltage supply line PLA, the second voltage supply line PLB, and the sensing line SL.

The data driver 300 may supply data voltages Vdata to the data lines DL1 to DLd.

The data driver 300 may be mounted on a chip on film attached on the display panel 100. Also, the data driver 300 may be directly equipped in the display panel 100 and may be connected to the controller 400 mounted on a main substrate.

The data driver 300 may be implemented as one integrated circuit (IC) along with the controller 400. In this case, the IC may be mounted on the chip on film, or may be directly equipped in the display panel 100.

The data driver 300 may receive a sensing signal associated with a characteristic variation of the driving transistor Tdr, included in the light emitting display panel 100, from the light emitting display panel 100 and may transfer the sensing signal to the controller 400.

The gate driver 200 may be implemented as an IC and may be provided in the non-display area 130. Alternatively, the gate driver 200 may be directly embedded in the non-display area 130 by using a gate in panel (GIP) type. When the GIP type is used, transistors configuring the gate driver 200 may be provided in the non-display area 130 through the same process as transistors included in each pixel 110.

When the gate pulse generated by the gate driver 200 is supplied to a gate of the switching transistor Tsw1 included in the pixel 110, the switching transistor Tsw1 may be turned on. When a gate off signal is supplied to the switching transistor Tsw1, the switching transistor Tsw1 may be turned off. The gate signal GS supplied to the gate line GL may include a gate pulse and a gate off signal.

Finally, the controller 400 may include a data aligner which realigns input video data transferred from an external system on the basis of a timing synchronization signal transferred from the external system to generate image data Data and supplies the image data Data to the data driver 300, a control signal generator which generates the gate control signal GCS and the data control signal DCS by using the timing synchronization signal, an input unit which receives the timing synchronization signal and the input video data transferred from the external system and respectively transfers the timing synchronization signal and the input video data to the data aligner and the control signal generator, and an output unit which supplies the data driver 300 with the image data Data generated by the data aligner and the data control signal DCS generated by the control signal generator and supplies the gate driver 200 with the gate control signals GCS generated by the control signal generator.

The controller 400 may analyze touch sensing signals received through a touch panel embedded in or attached on the light emitting display panel 100 and may further perform a function of sensing the presence of a touch and a touch position.

The external system may perform a function of driving the controller 400 and an electronic device. For example, when the electronic device is a TV, the external system may receive various sound information, video information, and letter information over a communication network and may transfer the received video information to the controller 400. In this case, the image information may include input video data.

Hereinafter, a light emitting display panel having a pixel structure illustrated in FIG. 2 among various types of light emitting display panels will be described as an example of a light emitting display panel applied to the present disclosure.

Figure 3:
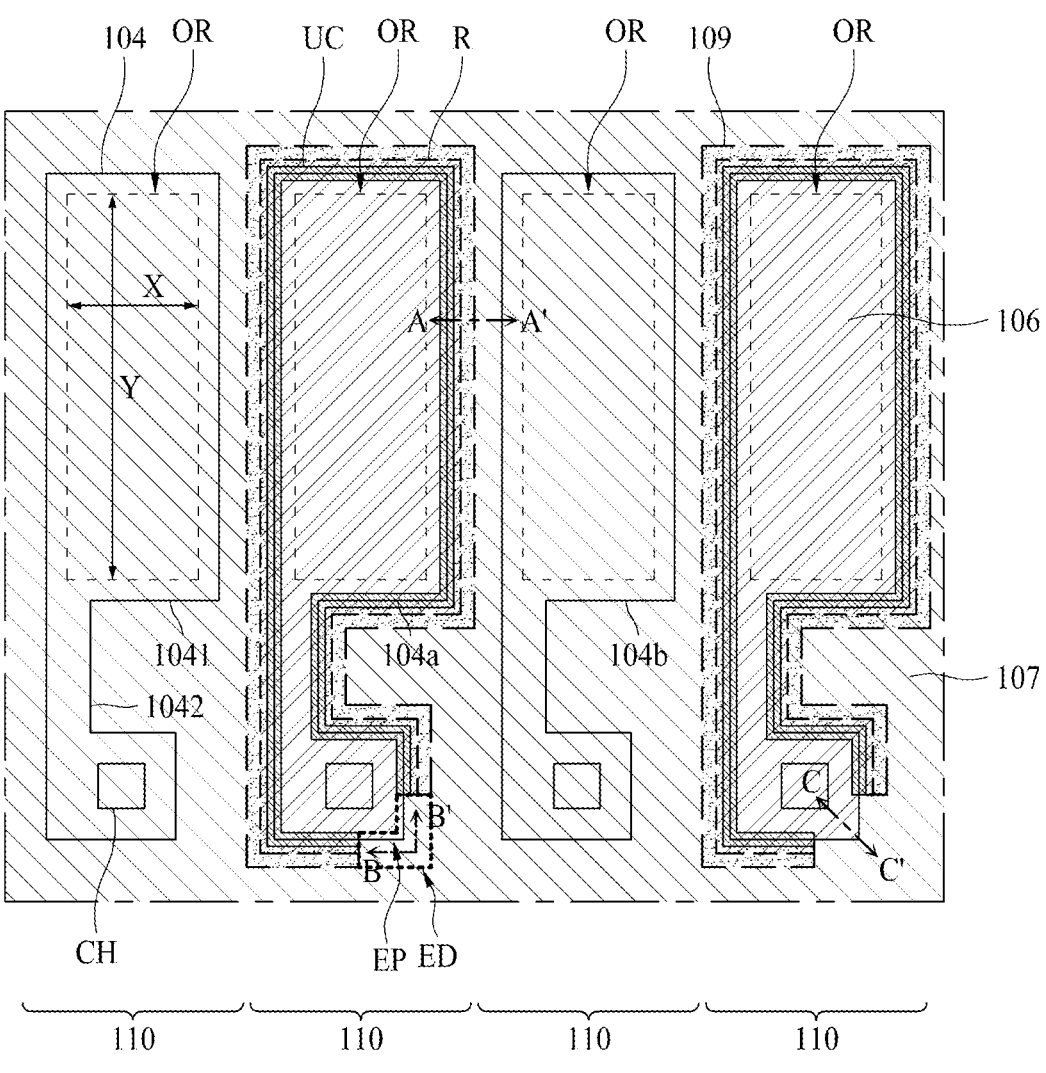
FIG. 3 is a plan view illustrating four pixels included in a light emitting display panel according to the present disclosure.
Figure 4:
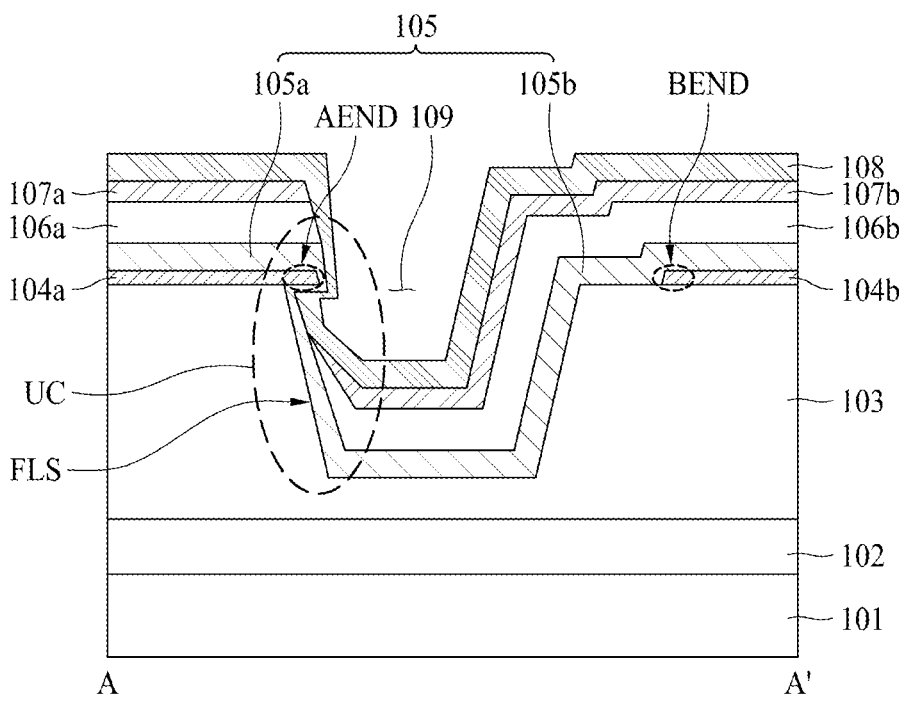
FIG. 4 is an example diagram illustrating a cross-sectional surface taken along line A-A' illustrated in FIG. 3.
Figure 5:
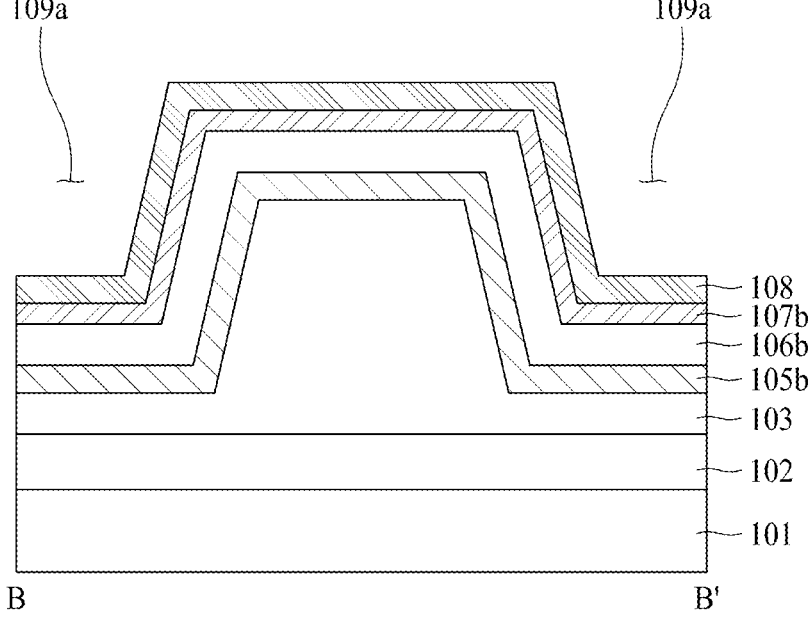
FIG. 5 is an example diagram illustrating a cross-sectional surface taken along line B-B' illustrated in FIG. 3.
Figure 6:
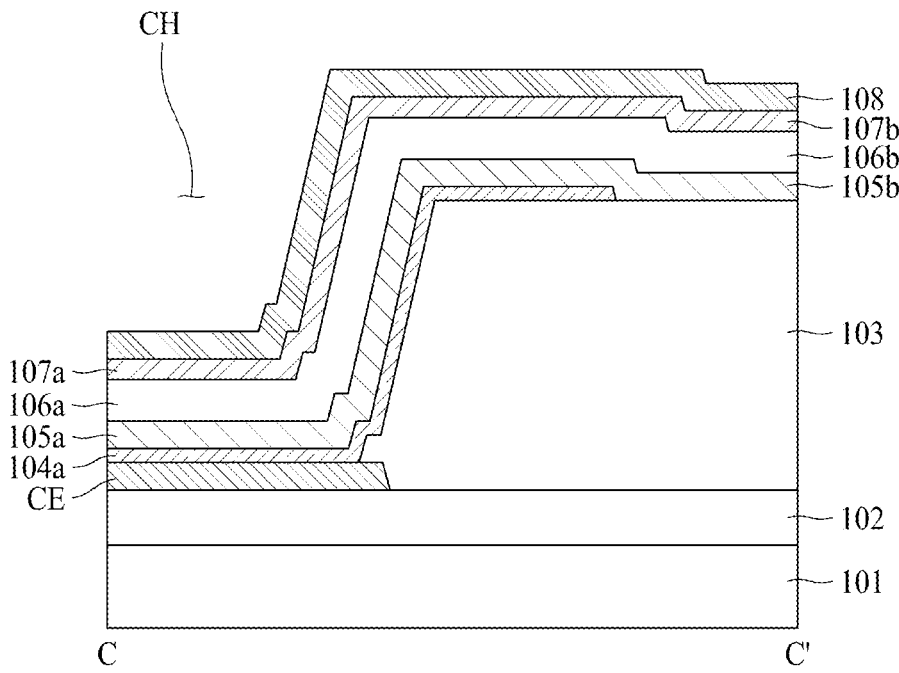
FIG. 6 is an example diagram illustrating a cross-sectional surface taken along line C-C' illustrated in FIG. 3.

FIG. 3 is a plan view illustrating four pixels included in a light emitting display panel according to the present disclosure. FIG. 4 is an example diagram illustrating a cross-sectional surface taken along line A-A' illustrated in FIG. 3. FIG. 5 is an example diagram illustrating a cross-sectional surface taken along line B-B' illustrated in FIG. 3. FIG. 6 is an example diagram illustrating a cross-sectional surface taken along line C-C' illustrated in FIG. 3. Particularly, in FIGS. 3 to 6, four pixels arranged along an $n^{th}$ gate line GLn illustrated in FIG. 1 are illustrated.

The light emitting display panel according to the present disclosure, as illustrated in FIGS. 3 to 6, may include a planarization layer 103 provided in a substrate 101, anodes 104 provided on the planarization layer 103, a bank 105 including opening regions exposing the anodes 104, a light emitting layer 106 provided on the anodes 104 and the bank 105, and a cathode 107 which is provided on the light emitting layer 106 and the cathode 107 includes a first cathode 107a and a second cathode 107b.

In the following description, in describing common features of the anodes, a reference numeral 104 refers to an anode, and when a first anode and a second anode of the anodes are adjacent to each other, a reference numeral 104a refers to a first anode and a reference numeral 104b refers to a second anode.

The first anode 104a and the second anode 104b may be formed through the same process, and thus, may include the same material.

In the present disclosure, an undercut UC or an undercut structure UC may be provided outside at least one of the first anode 104a and the second anode 104b adjacent to each other. The first cathode 107a and the second cathode 107b which are disconnected from each other at the undercut UC (see FIG. 4) may be connected to each other at an end portion EP of the first anode 104a including the undercut UC (for example, a region ED apart from an opening region OR of the first anode 104a).

A contact hole CH may be provided in a region adjacent to the region ED that is spaced apart from the opening region OR of the first anode 104a.

Moreover, the undercut UC may not be provided in the region ED that is spaced apart from the opening region OR of the first anode 104a.

That is, the first cathode 107a and the second cathode 107b which are disconnected from each other at the undercut UC may be connected to each other at a region ED that does not include an undercut UC. In this case, at the region ED that does not include the undercut UC, the contact hole CH may be provided adjacent in said region, or in some cases, only a portion of the contact hole CH may be provided adjacent in said region, or in other cases, the contact hole CH may not be provided in said region. In this case, an example where the undercut UC is provided only in the first anode 104a will be described with reference to FIGS. 3 to 9. That is, in the light emitting display panel illustrated in FIGS. 3 to 9, the undercut UC may be provided in only one of two anodes adjacent to each other.

Moreover, an example where the undercut UC is provided in all of the first anode 104a and the second anode 104b will be described with reference to FIGS. 10 and 11. That is, in the light emitting display panel illustrated in FIGS. 10 and 11, the undercut UC may be provided in all anodes 104.

Moreover, in the light emitting display panel illustrated in FIGS. 3 to 6, a connection electrode CE connecting a first anode to a driving transistor Tdr may be exposed at a contact hole CH of a first anode 104a, and the first anode 104a may cover all of the connection electrode CE. That is, all of the connection electrode CE exposed at the contact hole CH may be covered by the first anode 104a. In this case, a relationship between an anode-based connection electrode CE and an anode may be variously set. That is, there may be a pixel where all of a connection electrode CE exposed at a contact hole CH is covered by an anode and a pixel where a portion of a connection electrode CE exposed at a contact hole CH is covered by an anode.

Moreover, in the light emitting display panel illustrated in FIGS. 7 to 11, a connection electrode CE connecting a first anode to a driving transistor Tdr may be exposed at a contact hole of a first anode 104a, and the first anode 104a may cover a portion of the connection electrode CE. That is, only a portion of the connection electrode CE exposed at the contact hole CH may be covered by the first anode 104a, and the other portion thereof may not be covered by the first anode 104a.

Hereinafter, as an example of the present disclosure, a light emitting display panel will be described where an undercut UC is provided in only the first anode 104a among the first anode 104a and the second anode 104b adjacent to each other along a gate line and all of the connection electrode CE exposed at the contact hole CH of the first anode 104a is covered by the first anode 104a, with reference to FIGS. 3 to 6.

A boundary groove 109 may be provided outside each of the anodes 104. Particularly, as illustrated in FIG. 3, the boundary groove 109 may be provided along the undercut UC.

In the following description, a first direction and a second direction which differs from the first direction may be variously set. For convenience of description, in the following description, the first direction may be defined as a horizontal direction of the light emitting display panel 100 illustrated in FIG. 1, and the second direction may be defined as a vertical direction of the light emitting display panel 100 illustrated in FIG. 1. In this case, a gate line GL may be arranged in the first direction, and a data line DL may be arranged in the second direction.

In the following description, the cathode 107 may include the first cathode 107a and the second cathode 107b. The first cathode 107a may cover the first anode 104a, and the second cathode 107b may be provided in the boundary groove 109 provided outside the first anode 104a.

In this case, in the light emitting display panel illustrated in FIG. 3, the second cathode 107b may further cover the second anode 104b having no undercut UC.

That is, in the light emitting display panel illustrated in FIG. 3, the first cathode 107a may cover an anode (e.g., the first anode 104a) including an undercut UC, and the second cathode 107b may cover the boundary groove 109 and may further cover an anode (e.g., the second anode 104b) including no undercut.

To provide an additional description, in FIG. 3, the first cathode 107a and the second cathode 107b may be disconnected from each other with respect to a dotted line illustrated by a reference numeral R. In this case, the dotted line illustrated by the reference numeral R may be formed along the undercut UC. That is, the first cathode 107a and the second cathode 107b may be disconnected from each other along the undercut UC. In this case, as illustrated in FIG. 3, the first cathode 107a and the second cathode 107b disconnected from each other may be connected to each other at an end of the first anode 104a including the undercut UC (for example, a region apart from the opening region of the first anode 104a). The undercut UC may not be provided in the region apart from the opening region of the first anode 104a. That is, the first cathode 107a and the second cathode 107b may be connected to each other in a region including no undercut.

An opening region OR may denote a region referred to by X and Y in FIG. 3. That is, in FIG. 3, X may represent a width of an opening region OR in the first direction, and Y may represent a width of an opening region OR in the second direction transverse to the first direction. An opening region OR may be formed by the bank 105. That is, the bank 105 may include opening regions OR at which anodes are exposed.

The first cathode 107a and the second cathode 107b may be disconnected from each other by the undercut UC provided in the boundary groove 109.

The undercut UC may be provided along an outer portion of the first anode 104a in the boundary groove 109. Particularly, as illustrated in FIG. 4, the undercut UC may be formed by a portion, extending to the boundary groove 109, of the first anode 104a and a lateral surface (e.g., a lateral surface of the planarization layer 103 exposed at the boundary groove 109) of the boundary groove 109.

Hereinafter, a basic structure of the light emitting display panel 100 applied to the present disclosure will be described with reference to FIGS. 3 to 6.

First, the substrate 101 may be a glass substrate or a plastic substrate, and moreover, may include various kinds of films.

A pixel driving circuit layer 102 including the driving transistor Tdr, as illustrated in FIG. 6, may be provided on the substrate 101.

A pixel driving circuit PDC including the driving transistor Tdr may be included in the pixel driving circuit layer 102. The pixel driving circuit PDC, as described above with reference to FIG. 2, may include a switching transistor Tsw1, a storage capacitor Cst, a driving transistor Tdr, and a sensing transistor Tsw2.

Moreover, the pixel driving circuit layer 102 may include a gate line GL, a data line DL, a sensing control line SCL, a sensing line SL, and a first voltage supply line PLA, which are connected to the pixel driving circuit PDC.

Therefore, the pixel driving circuit layer 102 may include at least two metal layers and at least two insulation layers for insulating the at least two metal layers.

Moreover, the pixel driving circuit layer 102 may further include a buffer provided between the driving transistor Tdr and the substrate 101.

Each of a buffer and the insulation layers may include at least one inorganic layer or at least one organic layer, or may include at least one inorganic layer and at least one organic layer.

Each of the metal layers may include at least one of various metals such as copper (Cu) and molybdenum-titanium alloy (MoTi).

The planarization layer 103 may be provided on the pixel driving circuit layer 102.

For example, the pixel driving circuit layer 102 may include various kinds of transistors and signal lines configuring the pixel driving circuit PDC. In this case, heights of the various kinds of transistors and the signal lines may differ, and a height of a region including transistors and signal lines may differ from that of a region including no transistors and signals.

Due to such a height difference, an upper surface formed by the transistors and the signal lines may not be flat. Accordingly, an upper surface of the pixel driving circuit layer 102 may not be flat.

The planarization layer 103 may perform a function of planarizing the upper surface of the pixel driving circuit layer 102. That is, the planarization layer 103 may be formed to have a height which is greater than that of the pixel driving circuit layer 102, and thus, the upper surface of the planarization layer 103 may configure a flat surface.

The planarization layer 103 may include at least one inorganic layer or at least one organic layer, or may include at least one inorganic layer and at least one organic layer.

The anodes 104 may be provided on the planarization layer 103. The anode 104 may configure a light emitting device ED. Although FIGS. 4 to 6 illustrate a cross-sectional surface of a pixel including the first anode 104a, but basic structures described below may be applied to pixels including all anodes in addition to the first anode 104a. Therefore, in description applied to all pixels in common among the following descriptions, although FIGS. 4 to 6 are referred to, the present disclosure will be described by using the anode 104, the cathode 107, the bank 105, and the light emitting layer 106 instead of the first anode 104a, the first cathode 107a, a first bank 105a, and a first light emitting layer 106a.

The anode 104, as illustrated in FIG. 2, may be electrically connected to the driving transistor Tdr included in the pixel driving circuit layer 102, and as illustrated in FIG. 3, may be patterned for each pixel 110.

The anode 104 may be one of two electrodes configuring the light emitting device ED. For example, when the light emitting device ED is an organic light emitting diode, the organic light emitting diode may include a first pixel electrode, a light emitting layer 106 provided on the first pixel electrode, and a second pixel electrode provided on the light emitting layer 106. The first pixel electrode may be the anode 104, and the second pixel electrode may be the cathode 107. In this case, the anode 104 may be connected to the driving transistor Tdr.

That is, the anode 104 provided on the planarization layer 103 may be electrically connected to a transistor included in the pixel driving circuit layer 102, and particularly, may be electrically connected to the driving transistor Tdr.

To this end, the contact hole CH may be provided in the light emitting display panel, and the connection electrode CE exposed at the contact hole CH may be connected to the anode 104. The connection electrode CE may be connected to the driving transistor Tdr.

The anode 104 may include a transparent electrode such as indium tin oxide (ITO) or indium zinc oxide (IZO), include an opaque electrode such as copper (Cu), or include a transparent electrode and an opaque electrode.

In a case where the light emitting display panel according to the present disclosure uses a top emission type (i.e., a type where light emits in an upward direction of the anode 104), the anode 104 may include at least one opaque electrode.

In a case where the light emitting display panel according to the present disclosure uses a bottom emission type (i.e., a type where light emits in a downward direction of the anode 104), the anode 104 may include at least one transparent electrode.

The anode 104 may include a main anode 1041 corresponding to an opening region OR (or in some embodiments, as shown in FIG. 3, a main anode 1041 includes an opening region OR) and a connection anode 1042 which extends from the main anode 1041 and is connected to the driving transistor Tdr.

A type of the connection anode 1042 may be configured as various types, based on a connection with the driving transistor Tdr.

A contact hole may be provided in an end of the connection anode 1042, and the connection anode 1042 may be connected to the connection electrode CE, in the contact hole CH. Accordingly, the first anode 104a may also include a main anode 1041 corresponding to an opening region and a connection anode 1042 extending from the main anode 1041, and a contact hole CH of the first anode 104a may be provided in an end of the connection anode 1042. As shown in FIG. 3, the main anode 1041 (or a main anode portion 1041) has a rectangular shape from a plan view and the connection anode 1042 (or a connection anode portion 1042) has an L-shape from a plan view and the connection anode portion 1042 extends from the main anode portion 1041.

In this case, an undercut may not be provided outside a region including the contact hole CH among outer portions of the first anode 104a. That is, an undercut may not be provided at a periphery of the contact hole CH. Accordingly, at the periphery of the contact hole CH, the first light emitting layer 106a and a second light emitting layer 106b may be continuously provided, and the first cathode 107a and the second cathode 107b may be continuously provided.

The boundary groove 109 may be provided outside the main anode 1041 and the connection anode 1042. That is, the boundary groove 109 may be provided in a region, including no anode 104, of the planarization layer 103.

Hereinafter, for convenience of description, except for a case where the main anode 1041 and the connection anode 1042 should be differentiated from each other, the main anode 1041 and the connection anode 1042 may not be differentiated from each other, and the present disclosure will be described by using the anode 104, the first anode 104a, and the second anode 104b.

The bank 105 may cover outer portions (or also referred to as "peripheral portions") of the anode 104 to configure an opening region OR through which light emitted from the pixel 110 is output. That is, in FIG. 3, an opening region OR having a width referred to by X and Y may not be covered by the bank 105.

The bank 105 may be formed to surround the outer portions of the anode 104.

That is, the bank 105 may cover the outer portions (or peripheral portions) of the anode 104 and the bank 105 may be provided throughout an entire surface of the substrate 101 so as to expose the anode 104 at the opening region OR.

However, the bank 105 may be formed to have various patterns configuring an opening region.

The bank 105 may prevent overlapping of light between adjacent pixels.

The bank 105 may include at least one inorganic layer or at least one organic layer, or may include at least one inorganic layer and at least one organic layer.

The bank 105 may include a first bank 105a and a second bank 105b. The first bank 105a may cover the first anode 104a, and the second bank 105b may be provided in the boundary groove 109 provided outside the first anode 104a. The second bank 105b may further cover the second anode 104b including no undercut UC. That is, the first bank 105a may cover an anode including an undercut, and the second bank 105b may cover the boundary groove 109 and may further cover an anode including no undercut.

The first bank 105a and the second bank 105b may be formed through the same process, and thus, may include the same material.

The light emitting layer 106 may be provided on the whole surface of the substrate 101 to cover the anodes 104 and the bank 105.

The light emitting layer 106 may include one of an organic light emitting layer, an inorganic light emitting layer, and a quantum dot light emitting layer, or may include a stack or combination structure of an organic light emitting layer (or an inorganic light emitting layer) and a quantum dot light emitting layer.

The light emitting layer 106 may include a hole injection layer (HIL), a hole transport layer (HTL), a hole blocking layer (HBL), an electron injection layer (EIL), an electron transport layer (ETL), an electron blocking layer (EBL), and a charge generating layer (CGL).

In a case where the light emitting layer 106 emits white light, the light emitting layer 106 may include hole injection layer (HIL)/hole transport layer (HTL), a blue organic layer, electron injection layer (EIL)/charge generating layer (CGL)/electron transport layer (ETL), a red organic layer, a yellow-green organic layer, electron injection layer (EIL)/charge generating layer (CGL)/electron transport layer (ETL), a blue organic layer, electron injection layer (EIL)/electron transport layer (ETL), and an organic buffer, which are sequentially stacked on the anode 104.

The light emitting layer 106 may include layers having various stack orders, in addition to layers having a stack order described above.

The light emitting layer 106 may be configured to emit light having various colors such as red, green, and blue and may be configured to emit white light.

In a case where the light emitting layer 106 emits white light, a color filter may be provided under the light emitting layer 106 or on the light emitting layer 106.

For example, the color filter may be provided between the planarization layer 103 and the pixel driving circuit layer 102 or may be provided in the planarization layer 103 or on the cathode, and moreover, may be provided at various positions. Particularly, the color filter may be provided at a position corresponding to an opening region of each pixel.

The light emitting layer 106 may include a first light emitting layer 106a and a second light emitting layer 106b. The first light emitting layer 106a may cover the first anode 104a, and the second light emitting layer 106b may be provided in a boundary groove 109 provided outside the first anode 104a. The second light emitting layer 106b may further cover the second anode 104b including no undercut UC. That is, the first light emitting layer 106a may cover an anode including an undercut, and the second light emitting layer 106b may cover the boundary groove 109 and may further cover an anode including no undercut.

The first light emitting layer 106a and the second light emitting layer 106b may be formed through the same process, and thus, may include the same material.

The cathode 107 may be provided on the light emitting layer 106, and particularly, may be provided in a plate shape on the whole surface of the substrate 101.

The cathode 107 may be a second pixel electrode which is an organic light emitting diode.

In a case where the light emitting display panel 100 according to the present disclosure uses the top emission type, the cathode 107 may include a transparent electrode, and for example, may include ITO or IZO.

In a case where the light emitting display panel 100 according to the present disclosure uses the bottom emission type, the cathode 107 may include at least one of various metals such as Cu and MoTi so as to reflect light, emitted from the light emitting layer 106, toward the anode 104.

The cathode 107 may include a first cathode 107a and a second cathode 107b. The first cathode 107a may cover the first anode 104a, and the second cathode 107b may be provided in the boundary groove 109 provided outside the first anode 104a. The second cathode 107b may further cover the second anode 104b including no undercut UC. That is, the first cathode 107a may cover an anode including an undercut, and the second cathode 107b may cover the boundary groove 109 and may further cover an anode including no undercut.

In this case, the first cathode 107a and the second cathode 107b may be disconnected from each other by the undercut UC provided in the boundary groove 109.

The first cathode 107a and the second cathode 107b disconnected from each other by the undercut UC may be connected to each other at an end portion EP of the first anode 104a. Particularly, the first cathode 107a and the second cathode 107b may be connected to each other through a region ED, including no undercut UC, of the end portion EP of the first anode 104a.

The first cathode 107a and the second cathode 107b may be formed through the same process, and thus, may include the same material.

Finally, the cathode 107 may be covered by a passivation layer 108.

In a case where the light emitting layer 106 emits white light, the cathode 107 may be covered by the passivation layer 108, a color filter may be provided at a portion, corresponding to the anode 104, of an upper end of the passivation layer 108, and a black matrix may be provided at a portion, corresponding to the bank 105, of the upper end of the passivation layer 108. Another passivation layer may be further provided on the black matrix and the color filter. Each pixel may emit, for example, one of red light, green light, white light, and blue light by using the color filter. However, as described above, the color filter may be provided at various positions of the light emitting display panel 100.

In a case where the light emitting layer 106 emits light having a unique color, the color filter may be omitted.

The passivation layer 108 may perform a function of an encapsulation layer. The encapsulation layer may include at least one inorganic layer or at least one organic layer, or may include at least one inorganic layer and at least one organic layer.

Hereinafter, a detailed structure of the light emitting display panel 100 illustrated in FIG. 3 will be described with reference to FIGS. 4 to 6. FIG. 4 illustrates a cross-sectional surface A-A' of a boundary groove 109 where an undercut UC is provided, FIG. 5 illustrates a cross-sectional surface B-B' of a periphery of a contact hole CH, and FIG. 6 illustrates a cross-sectional surface C-C' of the contact hole CH.

First, a structure of the cross-sectional surface A-A' where an undercut UC is provided will be described below with reference to FIGS. 3 and 4. As described above, in the light emitting display panel illustrated in FIG. 3, an undercut UC may be provided only at the peripheral portion of the first anode 104a among the first anode 104a and the second anode 104b adjacent to each other along a gate line.

First, the cathode 107 may include the first cathode 107a and the second cathode 107b, the boundary groove 109 may be provided outside the first anode 104a, the second cathode 107b may be provided in the boundary groove 109, the first cathode 107a may cover the first anode 104a, the second cathode 107b and the first cathode 107a may be disconnected from each other at the undercut UC provided in the boundary groove 109, and the undercut UC may be provided between the planarization layer 103 and an end AEND of the first anode 104a protruding toward the boundary groove 109.

To provide an additional description, the second cathode 107b may be provided in the boundary groove 109, and particularly, in the light emitting display panel illustrated in FIG. 3, the second cathode 107b may further cover the second anode 104b including no undercut UC.

The light emitting layer 106 may include the first light emitting layer 106a covering the first anode 104a and the second light emitting layer 106b provided in the boundary groove 109, and the second light emitting layer 106b and the first light emitting layer 106a may be disconnected from each other at the undercut UC provided in the boundary groove 109.

To provide an additional description, the second light emitting layer 106b may be provided in the boundary groove 109, and particularly, in the light emitting display panel illustrated in FIG. 3, the second light emitting layer 106b may further cover the second anode 104b including no undercut UC.

A height of the planarization layer 103 in the boundary groove 109 may be lower than that of the planarization layer where the first anode 104a and the second anode 104b are provided, the second bank 105b may be provided on the planarization layer 103 in the boundary groove 109, the second light emitting layer 106b may be provided on the second bank 105b provided in the boundary groove 109, the second cathode 107b may be provided on the second light emitting layer 106b provided in the boundary groove 109, and the first cathode 107a and the second cathode 107b may be covered by the passivation layer 108.

An end AEND of the first anode 104a, as illustrated in FIG. 4, may protrude toward the boundary groove 109, and an end BEND of the second anode 104b may not protrude toward the boundary groove 109. Accordingly, the undercut UC may be provided only at the peripheral portion of the first anode 104a.

The undercut UC may be formed by a lateral surface FLS of the planarization layer 103 (or a lateral surface of the boundary groove 109 before layers 105, 106, 107, and 108 are deposited on the boundary groove 109) and an end AEND of the first anode 104a protruding toward the boundary groove 109. The lateral surface of the boundary groove 109 may denote a lateral surface of the planarization layer 103 exposed at the boundary groove 109. The end AEND of the first anode 104a may protrude toward the boundary groove 109, on the lateral surface of the planarization layer 103 exposed at the boundary groove 109.

The first bank 105a and the second bank 105b, as illustrated in FIG. 4, may be continuously provided without being disconnected at the undercut UC.

However, when the first bank 105a and the second bank 105b include an inorganic material, the first bank 105a and the second bank 105b may be continuously provided without being disconnected at the undercut UC. In this case, the undercut UC may be formed by the first bank 105a covering the first anode 104a and the second bank 105b provided along the lateral surface of the planarization layer 103 under the first anode 104a.

The undercut UC may be provided between the lateral surface of the boundary groove 109 and the end of the first anode 104a protruding toward the boundary groove 109, and in more detail, the undercut UC may be formed by the lateral surface of the planarization layer 103 exposed at the boundary groove 103 adjacent to an end of an anode and the end of the first anode 104a protruding toward the boundary groove 109.

To provide an additional description, the end of the first anode 104a (i.e., an outer portion or a peripheral portion of the first anode 104a) protruding toward the boundary groove 109 may configure the undercut UC along with the lateral surface of the planarization layer 103.

Finally, as illustrated in FIG. 4, the second bank 105b may be provided on the planarization layer 103 in the boundary groove 109, the second light emitting layer 106b may be provided on the second bank 105b provided in the boundary groove 109, and the second cathode 107b may be provided on the second light emitting layer 106b provided in the boundary groove 109.

The second bank 105b provided in the boundary groove 109 may extend toward the second anode 104b through another lateral surface of the boundary groove 109 and may cover the second anode 104b. In this case, the second bank 105b may be disconnected from the first bank 105a at the undercut UC, or the second bank 105b and the first bank 105a may be continuously provided without being disconnected from each other. Also, the first bank 105a and the second bank 105b may not be provided in an opening region OR. That is, light may be output through the opening region OR.

The second light emitting layer 106b provided in the boundary groove 109 may extend toward the second anode 104b through another lateral surface of the boundary groove 109 and may cover an upper end of the second anode 104b. In this case, the second light emitting layer 106b may be disconnected from the first light emitting layer 106a at the undercut UC.

The second cathode 107b provided in the boundary groove 109 may extend toward the second anode 104b through another lateral surface of the boundary groove 109 and may cover the upper end of the second anode 104b. In this case, the second cathode 107b may be disconnected from the first cathode 107a at the undercut UC.

The second cathode 107b and the first cathode 107a may be covered by the passivation layer 108. The passivation layer 108 may be continuously provided without being disconnected from each other at the undercut UC.

As described above, the second light emitting layer 106b may be disconnected from the first light emitting layer 106a by the undercut UC, and the second cathode 107b may also be disconnected from the first cathode 107a by the undercut UC.

To provide an additional description, the light emitting layer 106 may be divided into the second light emitting layer 106b and the first light emitting layer 106a, based on a height difference of the boundary groove 109 and the undercut UC of the boundary groove 109, and the cathode 107 may also be divided into the first cathode 107b and the first cathode 107a, based on a height difference of the boundary groove 109 and the undercut UC of the boundary groove 109.

Therefore, a lateral leakage current (LLC) occurring in a pixel may not be transferred to a pixel adjacent thereto along a gate line. Accordingly, the emission of light caused by an LLC between adjacent pixels may decrease. That is, because the light emitting layer 106 is divided into the second light emitting layer 106b and the first light emitting layer 106a, a charge generating layer (CGL) provided in the light emitting layer 106 may be divided, thereby preventing the occurrence of an LLC between adjacent pixels.

Second, as described above, the undercut UC may be provided only at the peripheral portion of the first anode 104a among the first anode 104a and the second anode 104b adjacent to each other along the gate line in FIG. 3. In this case, the undercut UC may not be provided in a main surface of a contact hole CH connecting the first anode 104a to the driving transistor Tdr.

That is, as illustrated in FIG. 3, the undercut UC may be provided along an outer portion of the first anode 104a, but may not be provided at a portion, including the contact hole CH, of the outer portion of the first anode 104a. In this case, FIG. 5 illustrates a cross-sectional surface of a portion where an undercut is disconnected. In FIG. 5, a region referred to by a reference numeral 109a may be a region where the planarization layer 103 is formed through dry etching in a process of forming the undercut UC.

The pixel driving circuit layer 102, as illustrated in FIG. 5, may be provided on the substrate 101 at a portion where the undercut UC is disconnected, the planarization layer 103 may be provided on the pixel driving circuit layer 102, the second bank 105b may be provided on the planarization layer 103, the second light emitting layer 106b may be provided on the second bank 105b, the second cathode 107b may be provided on the second light emitting layer 106b, and the passivation layer 108 may be provided on the second cathode 107b.

That is, as described above, the second bank 105b, the second light emitting layer 106b, and the second cathode 107b may be provided at a portion, where the undercut UC is disconnected, of a periphery of a region where the contact hole CH is provided.

Third, the connection electrode CE connected to the driving transistor Tdr may be exposed at the contact hole CH.

The connection electrode CE may be provided on an upper surface of the substrate 101, provided in the pixel driving circuit layer 102, provided on an upper surface of the pixel driving circuit layer 102 as illustrated in FIG. 6, or provided in the planarization layer.

The connection electrode CE exposed at the contact hole CH may be covered by the first anode 104a. However, the connection electrode CE may be covered by the passivation layer provided between the pixel driving circuit layer 102 and the planarization layer 103, or the passivation layer may be covered by the planarization layer 103. The first anode 104a covering the connection electrode CE may extend to a lateral surface of the contact hole CH (for example, a lateral surface of the planarization layer 103 exposed at the contact hole CH), and the first anode 104a extending to the lateral surface of the planarization layer may extend up to the upper surface of the planarization layer 103.

The first bank 105a and the second bank 105b may be continuously provided on the first anode 104a in the contact hole CH.

The first light emitting layer 106a and the second light emitting layer 106b may be continuously provided on the first bank 105a and the second bank 105b provided in the contact hole CH.

The first cathode 107a and the second cathode 107b may be continuously provided on the first light emitting layer 106a and the second light emitting layer 106b provided in the contact hole CH.

The first cathode 107a and the second cathode 107b provided in the contact hole CH may be covered by the passivation layer 108.

As described above, in the contact hole CH, the connection electrode CE may be connected to the first anode 104a, the first light emitting layer 106a may be connected to the second light emitting layer 106b, and the first cathode 107a may be connected to the second cathode 107b.

Particularly, in the light emitting display panel illustrated in FIGS. 3 and 6, the first anode 104a may cover or overlap all of the connection electrode CE. Accordingly, the connection electrode CE may not be exposed in an upward direction of the first anode 104a.

Hereinabove, as an example of the present disclosure, a light emitting display panel will be described where the undercut UC is provided in only the first anode 104a among the first anode 104a and the second anode 104b and all of the connection electrode CE exposed at the contact hole CH of the first anode 104a is covered by the first anode 104a, with reference to FIGS. 3 to 6.

Hereinafter, as an example of the present disclosure, a light emitting display panel will be described where an undercut UC is provided in only a first anode 104a among the first anode 104a and a second anode 104b and all of a connection electrode CE exposed at a contact hole CH of the first anode 104a is covered by the first anode 104a, with reference to FIGS. 7 to 9. In the following description, descriptions which are the same as or similar to descriptions give above with reference to FIGS. 1 to 6 are omitted or will be briefly given.

Figure 7:
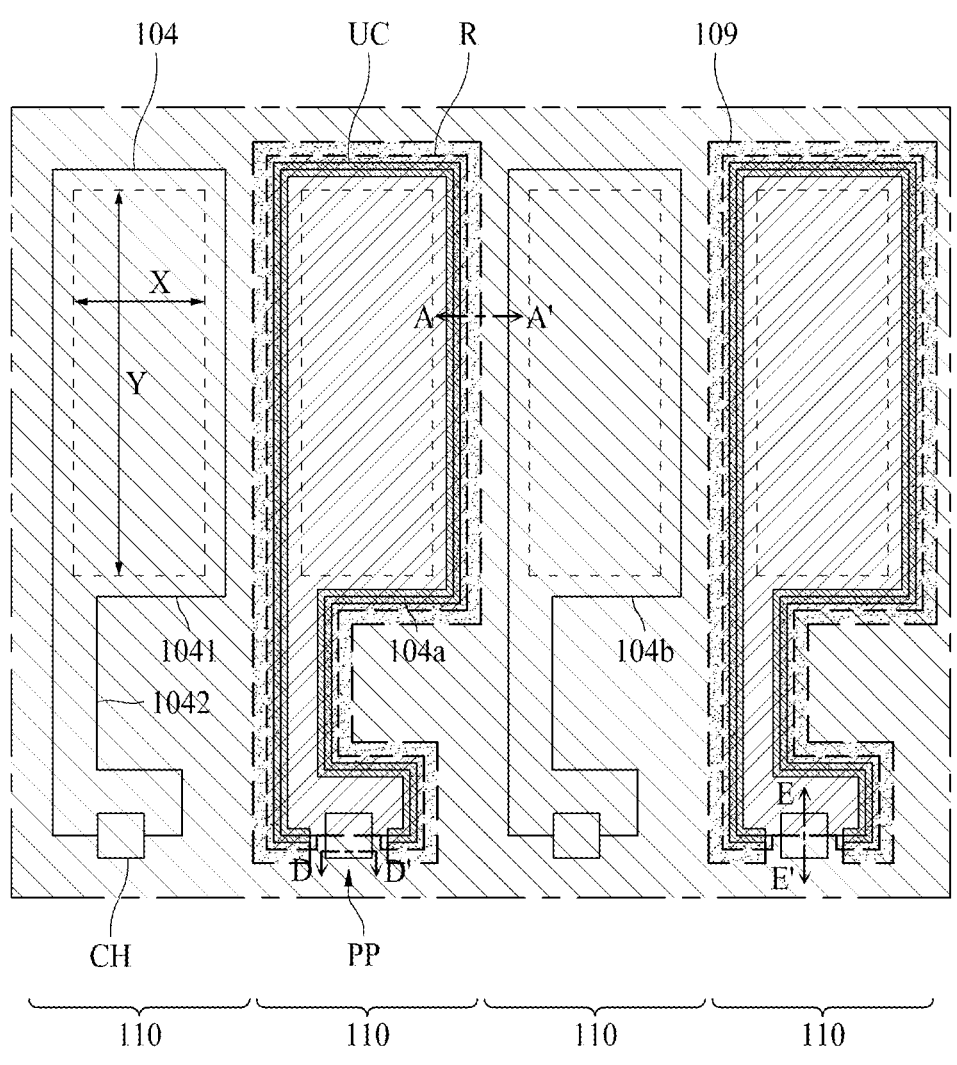
FIG. 7 is another plan view illustrating four pixels included in a light emitting display panel according to the present disclosure.
Figure 8:
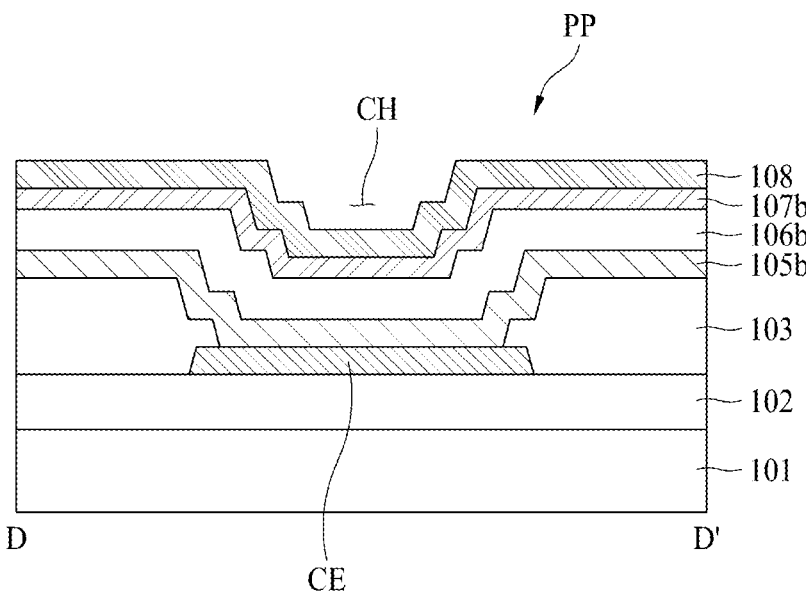
FIG. 8 is an example diagram illustrating a cross-sectional surface taken along line D-D' illustrated in FIG. 7.
Figure 9:
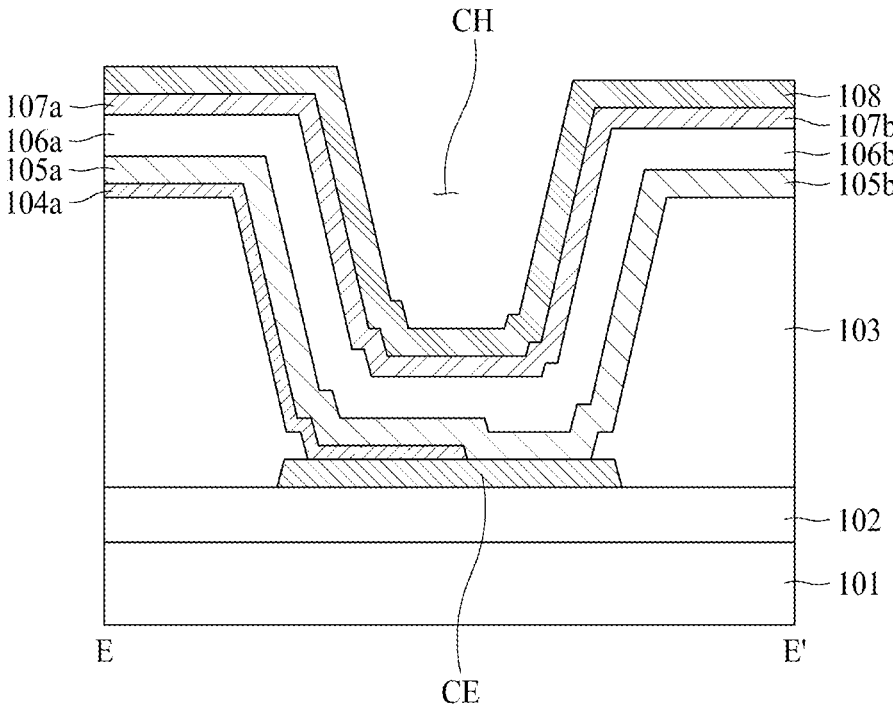
FIG. 9 is an example diagram illustrating a cross-sectional surface taken along line E-E' illustrated in FIG. 7.

FIG. 7 is another plan view illustrating four pixels included in a light emitting display panel according to the present disclosure, FIG. 8 is an example diagram illustrating a cross-sectional surface taken along line D-D' illustrated in FIG. 7, and FIG. 9 is an example diagram illustrating a cross-sectional surface taken along line E-E' illustrated in FIG. 7.

A cross-sectional surface taken along line A-A' of the light emitting display panel illustrated in FIG. 7 may be the same as the cross-sectional surface illustrated in FIG. 4.

That is, the light emitting display panel illustrated in FIG. 7 and the light emitting display panel illustrated in FIG. 3 may have common features in that an undercut UC is provided in only a first anode 104a among the first anode 104a and a second anode 104b adjacent to each other along a gate line. Accordingly, a cross-sectional structure between the first anode 104a and the second anode 104b of the light emitting display panel illustrated in FIG. 7 may be the same as a cross-sectional structure between the first anode 104a and the second anode 104b of the light emitting display panel illustrated in FIG. 3. Accordingly, a detailed description thereof is omitted.

A structure of a periphery of a contact hole CH will be described with reference to FIGS. 7 and 8.

As described above, in FIG. 7, the undercut UC may be provided only at the peripheral portion of the first anode 104a among the first anode 104a and the second anode 104b adjacent to each other along the gate line. In FIG. 7, the first cathode 107a and the second cathode 107b may be disconnected from each other with respect to a dotted line illustrated by a reference numeral R. In this case, the dotted line illustrated by the reference numeral R may be formed along the undercut UC. That is, the first cathode 107a and the second cathode 107b may be disconnected from each other along the undercut UC.

In this case, an undercut UC may not be provided at a periphery of the contact hole CH connecting the first anode 104a to a driving transistor Tdr. However, in some embodiments of the present disclosure, the undercut UC may not be provided at the periphery of the contact hole CH. That is, a region including no undercut UC may be variously changed at an end of the first anode 104a.

That is, as illustrated in FIG. 7, the undercut UC may be provided along an outer portion of the first anode 104a, but may not be provided at a portion PP, including the contact hole CH, of the outer portion of the first anode 104a. In this case, FIG. 8 illustrates a cross-sectional surface of a portion PP where an undercut is disconnected.

Particularly, in the light emitting display panel illustrated in FIG. 3, the contact hole CH may be fully covered by the first anode 104a (or be fully overlapped by the first anode 104a), but in the light emitting display panel illustrated in FIG. 7, only a portion of the contact hole CH may be covered by the first anode 104a (or overlapped by the first anode 104a) (see FIG. 9).

A pixel driving circuit layer 102, as illustrated in FIG. 8, may be provided on a substrate 101 at a portion PP where the undercut UC is disconnected (or not present), a connection electrode CE may be provided on the pixel driving circuit layer 102, a planarization layer 103 may be provided on the connection electrode CE, a second bank 105b may be provided on the planarization layer 103, a second light emitting layer 106b may be provided on the second bank 105b, a second cathode 107b may be provided on the second light emitting layer 106b, and a passivation layer 108 may be provided on the second cathode 107b.

That is, as described above, the second bank 105b, the second light emitting layer 106b, and the second cathode 107b may be provided at a portion, where the undercut UC is disconnected, of a periphery of a region where the contact hole CH is provided. That is, the light emitting layer 106 and the cathode 107 may not be disconnected from each other in a region where the undercut UC is not provided.

The connection electrode CE may be provided on an upper surface of the substrate 101, provided in the pixel driving circuit layer 102, provided on an upper surface of the pixel driving circuit layer 102 as illustrated in FIG. 8, or provided in the planarization layer 103.

In this case, in the cross-sectional surface described above with reference to FIG. 5, because the line B-B' illustrated in FIG. 3 does not overlap the contact hole CH, the connection electrode CE is not illustrated, but in the cross-sectional surface described above with reference to FIG. 8, because the line D-D' illustrated in FIG. 7 overlaps the contact hole CH, the connection electrode CE is illustrated.

Third, a connection electrode CE connected to a driving transistor Tdr may be exposed at the contact hole CH.

The connection electrode CE may be provided on an upper surface of the substrate 101, provided in the pixel driving circuit layer 102, provided on an upper surface of the pixel driving circuit layer 102 as illustrated in FIG. 9, or provided in the planarization layer.

In this case, because only a portion of the contact hole CH overlaps the first anode 104a as illustrated in FIG. 7, only a portion of the connection electrode CE may be covered by the first anode 104a as illustrated in FIG. 9. In the contact hole CH, a first bank 105a and a second bank 105b may be continuously provided on the first anode 104a. That is, the first anode 104a and the connection electrode CE may be fully covered by the first bank 105a and the second bank 105b.

A first light emitting layer 106a and a second light emitting layer 106b may be continuously provided on the first bank 105a and the second bank 105b provided in the contact hole CH.

A first cathode 107a and a second cathode 107b may be continuously provided on the first light emitting layer 106a and the second light emitting layer 106b provided in the contact hole CH.

The first cathode 107a and the second cathode 107b provided in the contact hole CH may be covered by a passivation layer 108.

As described above, in the contact hole CH, the connection electrode CE may be connected to the first anode 104a, the first light emitting layer 106a may be connected to the second light emitting layer 106b, and the first cathode 107a may be connected to the second cathode 107b.

Particularly, in the light emitting display panel illustrated in FIGS. 7 and 9, the first anode 104a may cover only a portion of the connection electrode CE. Accordingly, another portion of the connection electrode CE may not be exposed in an upward direction of the first anode 104a.

In the present disclosure, in the contact hole CH, the first light emitting layer 106a may be connected to the second light emitting layer 106b, and the first cathode 107a may be connected to the second cathode 107b. In this case, the connection electrode CE may be fully covered by the first anode 104a as illustrated in FIG. 6, or only a portion of the connection electrode CE may be covered by the first anode 104a as illustrated in FIG. 9.

Particularly, in a case where an undercut is formed in a structure illustrated in FIGS. 3 to 9, a region where the undercut is formed may be reduced, and thus, the reliability of a light emitting display apparatus may be enhanced.

Hereinafter, as an example of the present disclosure, a light emitting display panel will be described where an undercut UC is provided in all anodes 104 and only a portion of the connection electrode CE exposed at the contact hole CH of the anode 104 is covered by the anode 104, with reference to FIGS. 10 and 11. In the following description, descriptions which are the same as or similar to descriptions give above with reference to FIGS. 1 to 9 are omitted or will be briefly given.

Figure 10:
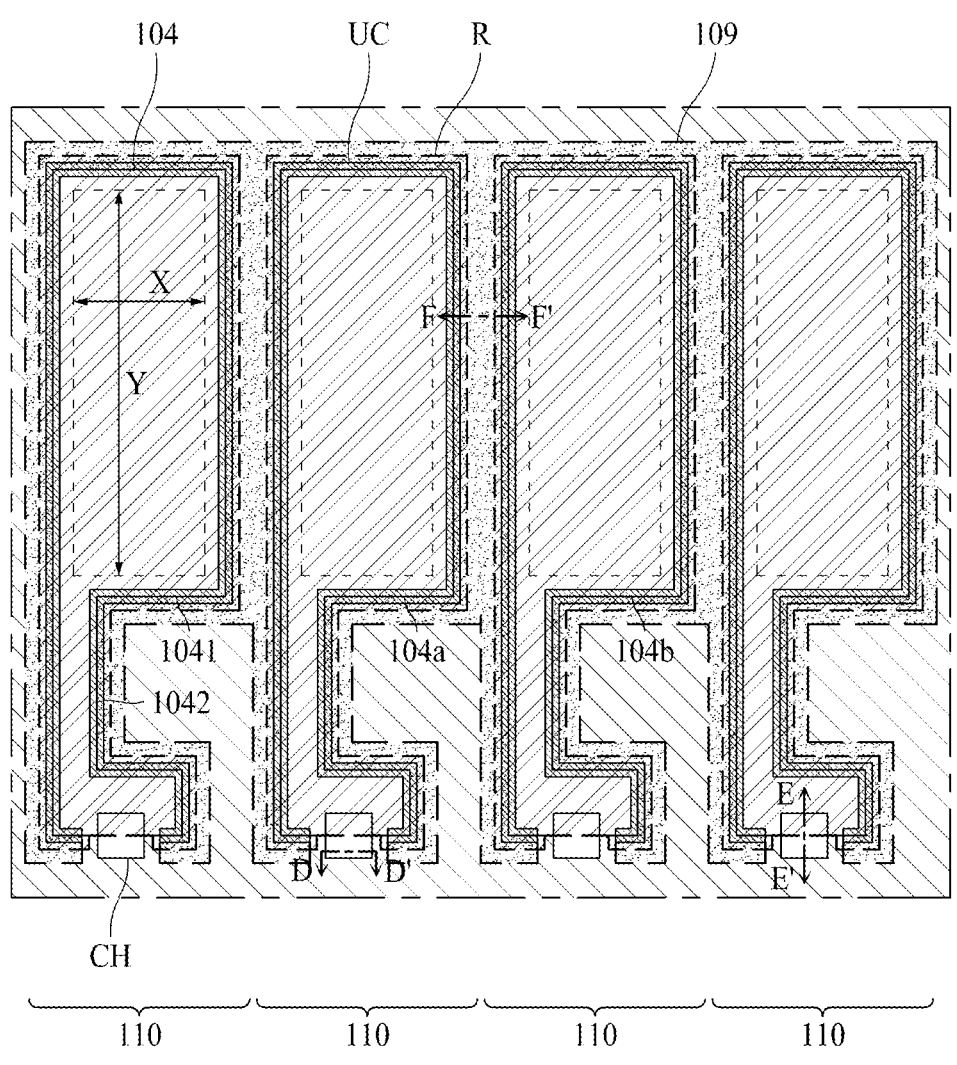
FIG. 10 is another plan view illustrating four pixels included in a light emitting display panel according to the present disclosure.
Figure 11:
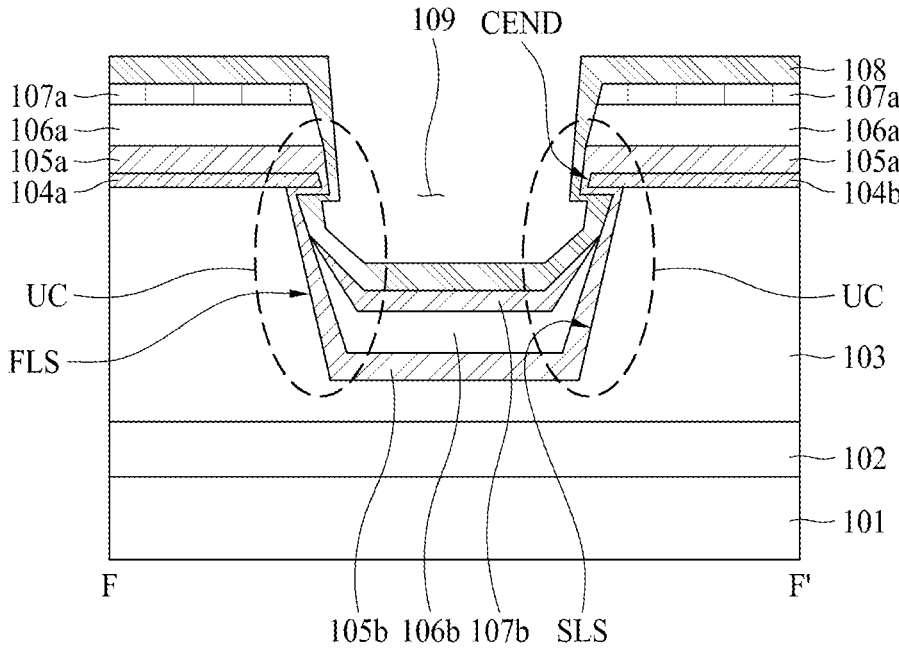
FIG. 11 is an example diagram illustrating a cross-sectional surface taken along line F-F' illustrated in FIG. 10.

FIG. 10 is another plan view illustrating four pixels included in a light emitting display panel according to the present disclosure, and FIG. 11 is an example diagram illustrating a cross-sectional surface taken along line F-F' illustrated in FIG. 10.

A cross-sectional surface taken along line F-F' of the light emitting display panel illustrated in FIG. 10 may differ from the cross-sectional surface illustrated in FIG. 4.

That is, in the light emitting display panel illustrated in FIG. 3, the undercut UC may be provided only at the peripheral portion of the first anode 104a among the first anode 104a and the second anode 104b adjacent to each other along the gate line, but in the light emitting display panel illustrated in FIG. 10, an undercut UC may be provided in all of a first anode 104a and a second anode 104b.

Therefore, in the light emitting display panel illustrated in FIG. 3, the undercut UC may be provided only at the peripheral portion of the first anode 104a as illustrated in FIG. 4, but in the light emitting display panel illustrated in FIG. 10, the undercut UC may be provided along an outer portion of the first anode 104a and an outer portion of the second anode 104b as illustrated in FIG. 11. In this case, the undercut UC may not be provided in a region, which is farthest away from an opening region, of an outer portion of the first anode 104a, and the undercut UC may not be provided in a region, which is farthest away from an opening region, of an outer portion of the second anode 104b.

In the above description, it may be defined that the cathode 107 includes the first cathode 107a and the second cathode 107b, the second cathode 107b is provided in the boundary groove 109, the first cathode 107a covers the first anode 104a, and the second cathode 107b and the first cathode 107a are disconnected from each other at the undercut UC provided in the boundary groove 109. That is, in FIG. 10, the first cathode 107a and the second cathode 107b may be disconnected from each other with respect to a dotted line illustrated by a reference numeral R. In this case, the dotted line illustrated by the reference numeral R may be formed along the undercut UC. That is, the first cathode 107a and the second cathode 107b may be disconnected from each other along the undercut UC.

Moreover, it may be defined that the light emitting layer 106 includes the first light emitting layer 106a covering the first anode 104a and the second light emitting layer 106b provided in the boundary groove 109, and the second light emitting layer 106b and the first light emitting layer 106a are disconnected from each other at the undercut UC provided in the boundary groove 109.

In this case, in the light emitting display panel illustrated in FIGS. 3 to 9, because an undercut is not provided outside the second anode 104b, the second cathode 107b and the second light emitting layer 106b may further cover the second anode 104b.

However, in the light emitting display panel illustrated in FIGS. 10 and 11, the undercut UC may be provided at an outer portion of the second anode 104b as well as an outer portion of the first anode 104a.

Therefore, in FIG. 11, a light emitting layer covering the second anode 104b is referred to by 106a which is a reference numeral representing a first light emitting layer, and a cathode covering the second anode 104b is referred to by 107a which is a reference numeral representing a first cathode.

That is, the present disclosure may have a feature where the first cathode 107a and the first light emitting layer 106a covering the anode are disconnected from the second cathode 107b and the second light emitting layer 106b provided in the boundary groove 109.

In this case, as illustrated in FIGS. 3 and 7, the second cathode 107b and the second light emitting layer 106b may further cover an anode (for example, the second anode 104b) including no undercut, in addition to the boundary groove 109, and in a case where an undercut is provided at outer portions of all anodes, as illustrated in FIGS. 10 and 11, only the boundary groove 109 may be provided.

That is, a first bank 105a, a first light emitting layer 106a, and a first cathode 107a each covering the first anode 104a may be disconnected from a second bank 105b, a second light emitting layer 106b, and a second cathode 107b each provided in the boundary groove 109.

Moreover, a first bank 105a, a first light emitting layer 106a, and a first cathode 107a each covering the second anode 104b may be disconnected from a second bank 105b, a second light emitting layer 106b, and a second cathode 107b each provided in the boundary groove 109.

Therefore, the first bank 105a, the first light emitting layer 106a, and the first cathode 107a each covering the first anode 104a may be disconnected from the first bank 105a, the first light emitting layer 106a, and the first cathode 107a each covering the second anode 104b, in the boundary groove 109, Except for differences described above, all descriptions given above with reference to FIG. 4 may be identically applied to descriptions of FIG. 11.

Because the light emitting display panel illustrated in FIG. 10 and the light emitting display panel illustrated in FIG. 7 have a common feature where only a portion of the contact hole CH overlaps the first anode 104a, a cross-sectional surface of a line D-D' illustrated in FIG. 10 may have the same structure as that of the cross-sectional surface of the line D-D' illustrated in FIG. 7, and a cross-sectional surface of a line E-E' illustrated in FIG. 10 may have the same structure as that of the cross-sectional surface of the line E-E' illustrated in FIG. 7. Accordingly, detailed descriptions thereof are omitted.

According to the light emitting display apparatus described above with reference to FIGS. 10 and 11, in a process of manufacturing the light emitting display apparatus, a light emitting layer and a cathode may be connected to each other in a contact hole CH without adding a photomask. Accordingly, the number of masks may decrease. That is, in a process of manufacturing the light emitting display apparatus described above with reference to FIGS. 10 and 11, wet etching may be performed in a state where a photoresist PR is covered, in patterning a first cathode, and then, dry etching may be performed without stripping of the photoresist PR, whereby it may not be needed to add a mask.

According to the present disclosure described above, the boundary groove 109 may be formed in left and right regions between pixels, which are main paths of an LLC and leakage light, and the second light emitting layer 106b and the first light emitting layer 106a may be disconnected from each other by the undercut UC provided in the boundary groove 109, and the second cathode 107b may be disconnected from the first cathode 107a. Accordingly, an LLC and leakage light may be blocked by the second light emitting layer 106b and the first light emitting layer 106a disconnected from each other by the undercut UC and the second cathode 107b and the first cathode 107b disconnected from each other.

That is, as described above, because the first light emitting layer 106a is disconnected from the second light emitting layer 106b by the undercut UC provided in the boundary groove 109, the occurrence of an LLC through a light emitting layer between adjacent pixels may be prevented.

Also, although the first light emitting layer 106a is not completely disconnected from the second light emitting layer 106b, because the first cathode 107a is disconnected from the second cathode 107b in the boundary groove 109, the occurrence of an LLC and leakage light through the light emitting layer 106 and the cathode 107 between adjacent pixels may be prevented.

Referring to FIG. 11, a first undercut structure UC may refer to as the undercut in the left in FIG. 11 and a second undercut structure UC facing the first undercut structure UC may refer to as the undercut in the right in FIG. 11. Here, the second undercut structure is formed based on a second lateral surface SLS of the planarization layer 103 and an end CEND of the second anode 104*b* protruding towards the first anode 104*a* or the boundary groove 109. The second lateral surface SLS is opposite and faces the first lateral surface FLS of the planarization layer 103. As shown, the end CEND of the second anode 104*b* is spaced apart from the second lateral surface SLS of the planarization layer 103.

A bank 105 or a bank layer 105 including 105*a* and 105*b* is on the first anode 104*a* and the second anode 104*b*. The bank layer 105 continuously extends between the first anode 104*a* and the second anode 104*b* and covers the first undercut structure and the second undercut structure.

In FIG. 11, the light emitting layer 106 has at least three parts. A first light emitting layer (106*a* on the left in FIG. 11) is between the first anode 104*a* and the first cathode (107*a* on the left in FIG. 11). A second light emitting layer (106*a* on the right in FIG. 11) is between the second anode 104*b* and the second cathode (107*a* on the right in FIG. 11). A third light emitting layer 106*b* between the first undercut structure and the second undercut structure. The third light emitting layer 106*b* is disconnected from the first and second light emitting layers.

The passivation layer 108 is on the first cathode and the second cathode and continuously extends between the first cathode and the second cathode. The passivation layer 108 is disposed over the first undercut structure and the second undercut structure and covers the various layers underneath it as shown in FIG. 11.

Moreover, according to the present disclosure, a first cathode and a second cathode disconnected from each other at an undercut may be connected to each other in a portion, which is far away from an opening region, of an anode (for example, a contact hole connecting the anode to a driving transistor). Accordingly, the shrinkage of an emission area of a light emitting device may be prevented or delayed. That is, a region where the undercut UC is disconnected may be in a region far away from an opening region, and thus, the reliability of the undercut UC may be improved and an adverse effect caused by a reduction in reliability of the undercut UC may be minimized on an opening region.

To provide an additional description, in TVs including a light emitting display apparatus (for example, a display apparatus including an organic light emitting diode (OLED), it may be important to prevent a time, at which the shrinkage of an emission area occurs, from occurring within a lifetime (for example, viewing for 30,000 hours for 10 years) of a product.

Generally, when an undercut (a home structure) is applied, a cover defect (for example, E-PAS cover NG) of a passivation layer caused by a reduction in depth may easily occur in an end (for example, a region where cathodes disconnected from each other are connected to each other) of the undercut (caused by a reduction in arrival angle of a chemical vapor deposition (CVD) or physical vapor deposition (PVD) source). Accordingly, there may be high possibility that an anode and a cathode are damaged, and thus, the shrinkage of an emission area may occur. That is, in depositing a second cathode and a passivation layer (EPAS (PAS3)), when an undercut depth is reduced, an arrival angle of a cathode material and a CVD precursor may be narrow, and due to this, a probability of coverage NG may increase.

However, as described above, when an end of an undercut (a region where a first cathode is connected to a second cathode) is disposed at a position far away from an emission area (an opening area), a region having possibility that a cover defect of a passivation layer occurs may be disposed at a position far away from the emission area, and thus, the shrinkage of an emission area may be prevented or delayed.

Hereinafter, in order to more clarify a structure of a light emitting display apparatus according to the present disclosure described above, a method of manufacturing a light emitting display apparatus according to the present disclosure (particularly, a method of forming an undercut UC) will be briefly described.

Figure 12A:
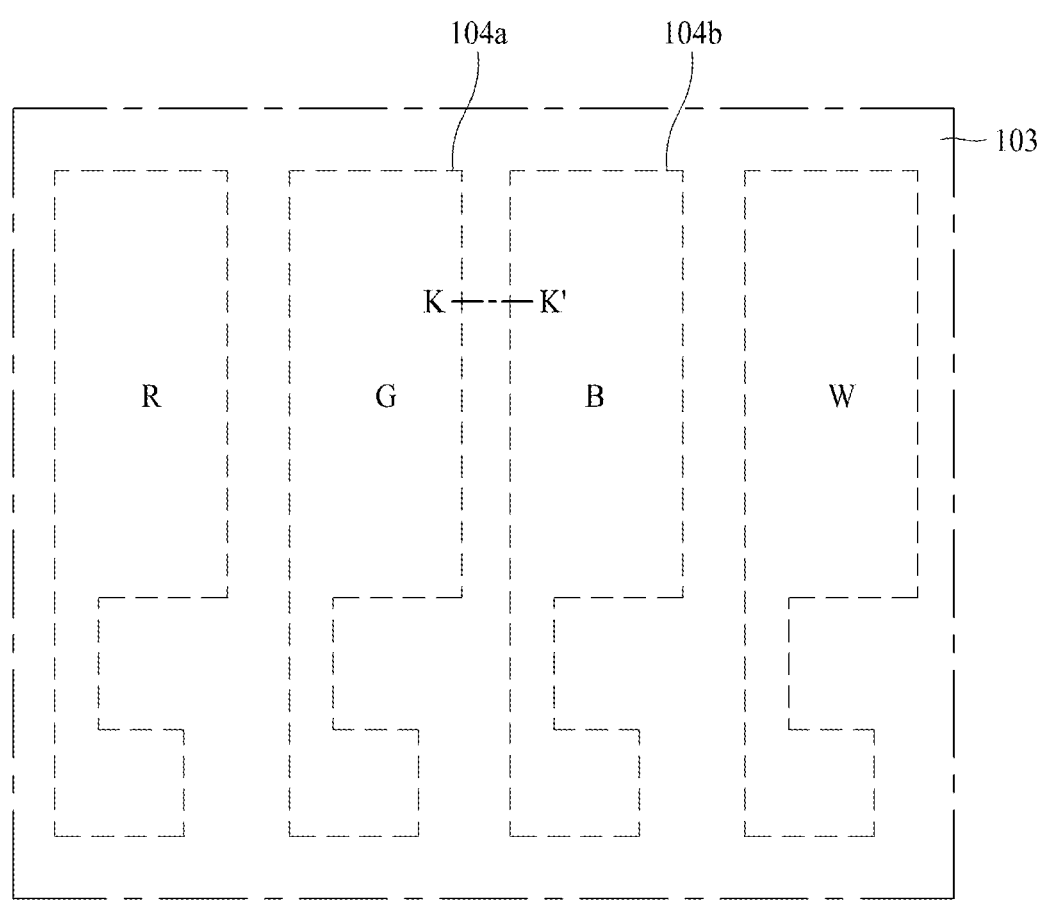
FIGS. 12A, 12B, 13A, 13B, 14A and 14B are example diagrams for describing a method of manufacturing a light emitting display apparatus according to the present disclosure.
Figure 12B:
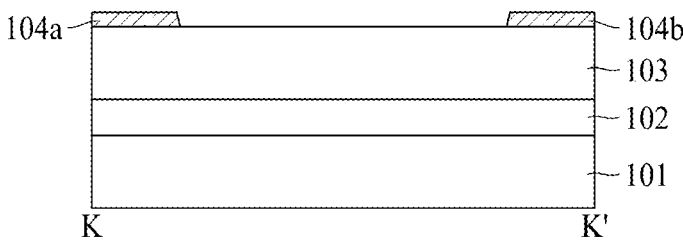
Figure 13A:
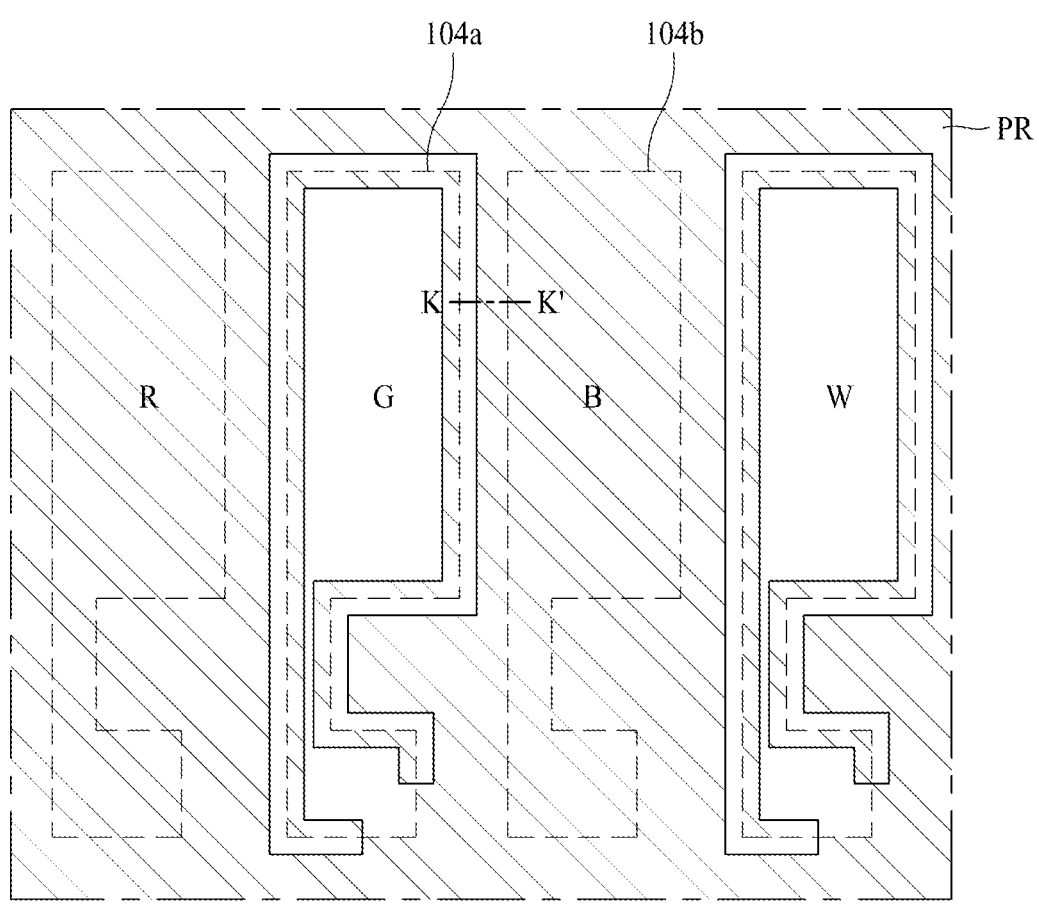
Figure 13B:
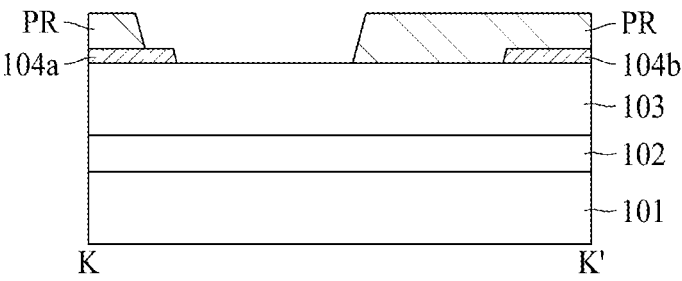
Figure 14A:
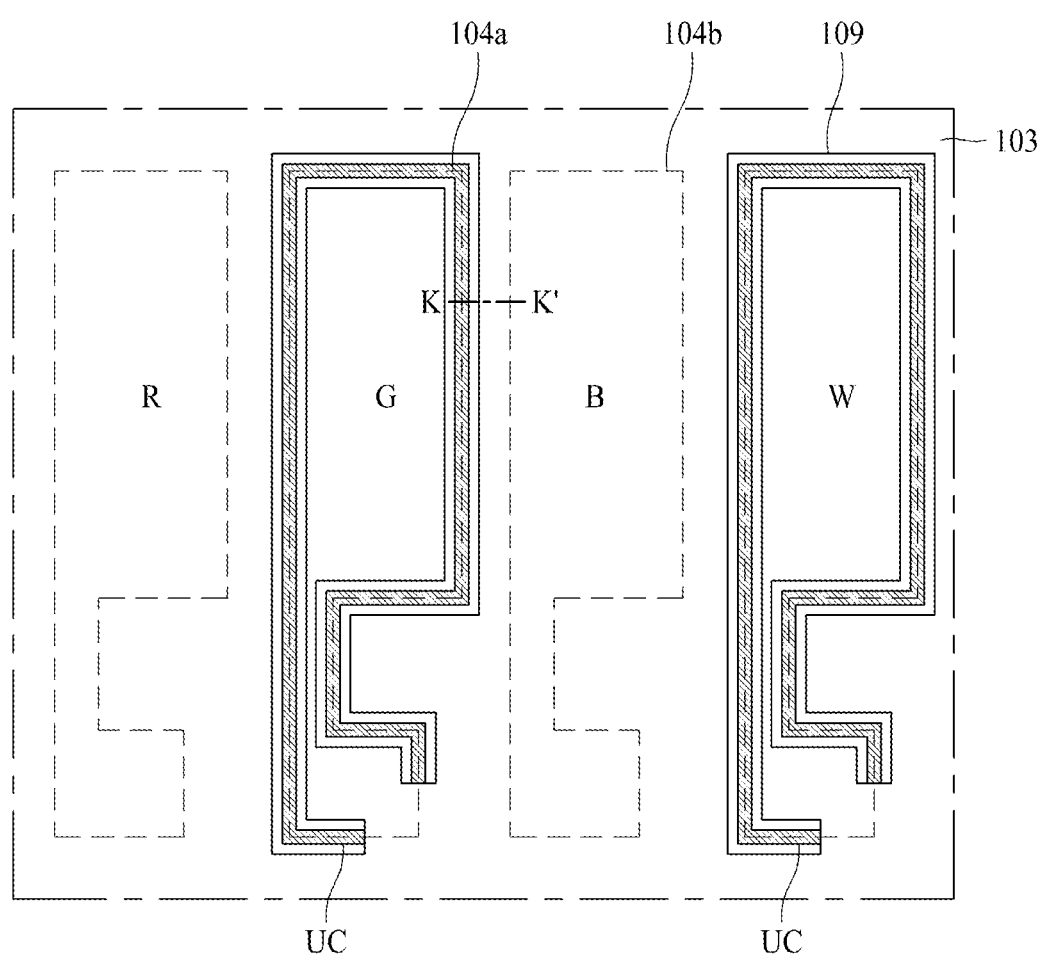
Figure 14B:
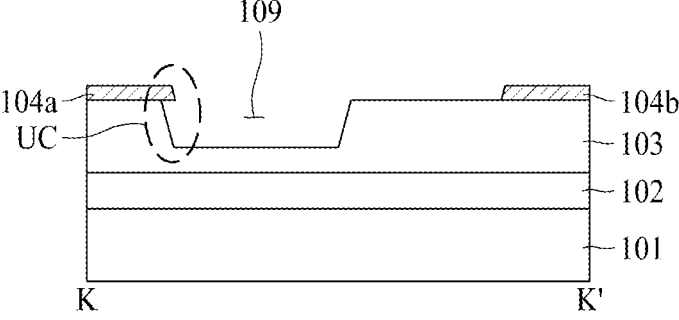

FIGS. 12A, 12B, 13A, 13B, 14A, and 14B are example diagrams for describing a method of manufacturing a light emitting display apparatus according to the present disclosure. FIG. 12A is a plan view illustrating four pixels included in a light emitting display panel, and FIG. 12B is an example diagram illustrating a cross-sectional surface taken along line K-K' illustrated in FIG. 12A. FIG. 13A is a plan view illustrating four pixels included in a light emitting display panel, and FIG. 13B is an example diagram illustrating a cross-sectional surface taken along line K-K' illustrated in FIG. 13A. FIG. 14A is a plan view illustrating four pixels included in a light emitting display panel, and FIG. 14B is an example diagram illustrating a cross-sectional surface taken along line K-K' illustrated in FIG. 14A. In the following description, descriptions which are the same as or similar to descriptions give above with reference to FIGS. 1 to 11 are omitted or will be briefly given.

First, a pixel driving circuit layer 102 including a driving transistor Tdr may be provided on a substrate 101.

Subsequently, a planarization layer 103 may be provided on the pixel driving circuit layer 102.

Subsequently, as illustrated in FIGS. 12A and 12B, anodes 104*a* and 104*b* may be provided on the planarization layer 103. The anodes 104*a* and 104*b* may be patterned for each pixel 110.

Subsequently, as illustrated in FIGS. 13A and 13B, a photoresist PR may be provided on the anodes 104*a* and 104*b*. In this case, the photoresist PR may be patterned for each pixel 110.

For example, as illustrated in FIGS. 13A and 13B, the photoresist PR may cover only an inner portion of a first anode 104*a* and may not be provided at an outer portion of the first anode 104, and moreover, may cover all of a second anode 104*b*. In this case, the photoresist PR provided inward from the first anode 104*a* may be connected to a photoresist, covering the second anode 104*b*, through an end of the first anode 104*a* (for example, a portion where a contact hole is to be formed).

Based on the photoresist PR provided in such a shape, as illustrated in FIGS. 3 and 7, a light emitting display panel may be manufactured where an undercut UC is provided at only an outer portion of the first anode 104*a*.

However, in FIGS. 13A and 13B, when the photoresist PR provided on the second anode 104*b* is not provided at an outer portion of the second anode 104*b* unlike the photoresist PR which is provided on the first anode 104*a*, as illustrated in FIG. 10, a light emitting display panel may be manufactured where an undercut UC is provided at an outer portion of each of the first anode 104*a* and the second anode 104*b*.

Subsequently, as illustrated in FIGS. 14A and 14B, the planarization layer 103 may be etched, and thus, a boundary groove 109 may be formed between anodes. That is, the boundary groove 109 may be provided along outer portions of the anodes, and particularly, may be provided along an undercut UC which is formed at the outer portions of the anodes.

As described above, when the photoresist PR is provided in a shape illustrated in FIGS. 13A and 13B, the light emitting display panel illustrated in FIGS. 3 and 7 may be manufactured where the undercut UC is provided at only the outer portion of the first anode 104*a*, and in FIGS. 13A and 13B, when the photoresist PR provided on the second anode 104*b* is not provided at the outer portion of the second anode 104*b* unlike the photoresist PR which is provided on the first anode 104*a*, the light emitting display panel illustrated in FIG. 10 may be manufactured where the undercut UC is provided at the outer portion of each of the first anode 104*a* and the second anode 104*b*.

A contact hole for connecting an anode to a driving transistor may be provided in a region, which is far away from an opening region, of the anode. For example, the contact hole may be formed in a region which less affects a capacitance and has no possibility that the other electrodes are exposed. Accordingly, the contact hole may be provided in the region far away from the opening region, so as to decrease interference between various kinds of electrodes or lines near the opening region.

In this case, as described above with reference to FIGS. 3 to 6, all of a connection electrode CE connecting the first anode 104*a* to a driving transistor Tdr may be covered by the first anode 104*a*.

Moreover, as described above with reference to FIGS. 7 to 11, only a portion of the connection electrode CE exposed at a contact hole CH may be covered by the first anode 104*a*, and the other portion may not be covered by the first anode 104*a*.

Based on a shape where the connection electrode CE is covered by the first anode 104*a*, a cross-sectional structure near the contact hole CH may be variously changed as illustrated in FIGS. 5, 6, 8, and 9.

Finally, a bank may be provided on the first and second anodes 104*a* and 104*b* and the planarization layer 103, and an opening region through which light is output may be formed in each of the first and second anodes 104*a* and 104*b*.

According to the present disclosure described above, because a first cathode and a second cathode disconnected from each other at an undercut UC are connected to each other at a position far away from an opening region of an anode (for example, an end of the anode), the shrinkage of an emission area of a light emitting device may be prevented. That is, in the present disclosure, because a region where the undercut UC ends or is disconnected is apart from the opening region of the anode, the shrinkage of the opening region may be prevented.

According to the present disclosure, light may be prevented from being emitted by an LLC between adjacent pixels, and thus, a color reproduction rate of a light emitting display apparatus may increase.

According to the present disclosure, a first cathode and a second cathode which are disconnected from each other at an undercut may be connected to each other at an end of an anode (for example, a position far away from an opening region of the anode). That is, a region including no undercut may not be provided in the end of the anode, and the first cathode and the second cathode may be connected to each other in the region including no undercut. Accordingly, the shrinkage of an emission area of a light emitting device may be prevented.

According to the present disclosure, an undercut having the same shape may be formed at a periphery of the anode, and thus, a passivation layer covering a cathode may be provided in the same shape along the undercut and may fully cover the cathode. Accordingly, a defect where the cathode is exposed by the passivation layer may decrease, and thus, the cathode may be prevented from being polluted, thereby preventing the shrinkage of the emission area of the light emitting device. Also, a time at which a defect, where the cathode is exposed by the passivation layer, occurs may be delayed, and thus, a time at which the shrinkage of the emission area of the light emitting device occurs may be delayed.

According to the present disclosure, because an LLC between pixels may be reduced, the degree of freedom in OLED Li doping of the light emitting device may be enhanced, and thus, a light emitting display apparatus having high luminance, high efficiency, and long lifetime may be implemented. That is, according to the present disclosure, a light emitting display apparatus having high luminance, high efficiency, and long lifetime may be implemented by freely adjusting the amount of doped lithium, and an LLC caused by Li doping may decrease.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of the inventive concepts described in this disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light emitting display apparatus, comprising:
   a planarization layer on a substrate;
   a plurality of anodes provided on the planarization layer;
   a bank including opening regions exposing the plurality of anodes;
   a light emitting layer provided on the plurality of anodes and the bank; and
   a cathode provided on the light emitting layer, the cathode including a first cathode and a second cathode,
   wherein an undercut is provided at an outer portion of at least one of a first anode and a second anode adjacent to each other,
   wherein the first cathode and the second cathode are disconnected from each other at the undercut and are connected to each other at an end of the first anode or the second anode or both, wherein the first cathode covers the first anode, and the second cathode is provided in a boundary groove provided at the outer portion of the first anode, and wherein the boundary groove is provided along the undercut.

2. The light emitting display apparatus of claim 1, wherein the first anode includes a main anode corresponding to an opening region and a connection anode extending from the main anode, and a contact hole is provided in an end of the connection anode.

3. The light emitting display apparatus of claim 1, wherein an undercut is not provided at the end of the first anode.

4. The light emitting display apparatus of claim 1, wherein the light emitting layer comprises:

a first light emitting layer covering the first anode; and a second light emitting layer provided in a boundary groove provided at the outer portion of the first anode, and wherein the first light emitting layer and the second light emitting layer are disconnected from each other at the undercut.

5. The light emitting display apparatus of claim 4, wherein the first light emitting layer and the second light emitting layer are connected to each other at the end of the first anode.

6. The light emitting display apparatus of claim 4, wherein the bank includes a first bank and a second bank, the first bank covers the first anode, and the second bank is provided in the boundary groove.

7. The light emitting display apparatus of claim 1, wherein a connection electrode connecting the first anode to a driving transistor is exposed at a contact hole provided in the end of the first anode, and wherein the first anode covers all of the connection electrode.

8. The light emitting display apparatus of claim 1, wherein a connection electrode connecting the first anode to a driving transistor is exposed at a contact hole provided in the end of the first anode, and wherein the first anode covers a portion of the connection electrode.

9. The light emitting display apparatus of claim 1, wherein the bank includes a first bank and a second bank, the first bank covers the first anode, and the second bank is provided in the boundary groove.

10. A light emitting display apparatus, comprising:

a planarization layer on a substrate;

at least one anode on the planarization layer, each anode of the at least one anode including a main anode portion having a rectangular shape from a plan view and a connection anode portion having an L-shape from the plan view, the connection anode portion extending from the main anode portion;

an undercut structure formed along an outer periphery of the main anode portion and the connection anode portion except at a first region in the connection anode portion;

a contact hole disposed to at least partially overlap with the connection anode portion;

a light emitting layer provided on the at least one anode; and a cathode provided on the light emitting layer, the cathode including a first cathode and a second cathode that is disconnected with each other at the undercut structure, wherein the first cathode and the second cathode disconnected from each other at the undercut structure are electrically connected to each other at the first region of the connection anode portion.

11. The light emitting display apparatus of claim 10, wherein the contact hole fully overlaps with the connection anode portion.

12. The light emitting display apparatus of claim 10, comprising a connection electrode electrically connecting the at least one anode to a driving transistor at the contact hole.

* * * * *